(12) United States Patent
Kim

(10) Patent No.: US 7,142,462 B2
(45) Date of Patent: Nov. 28, 2006

(54) INPUT SIGNAL RECEIVING DEVICE OF SEMICONDUCTOR MEMORY UNIT

(75) Inventor: Jin-hyun Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/919,370

(22) Filed: Aug. 17, 2004

(65) Prior Publication Data

US 2005/0128841 A1    Jun. 16, 2005

(30) Foreign Application Priority Data

Dec. 12, 2003    (KR) ...................... 10-2003-0090562

(51) Int. Cl.
*G11C 7/10*    (2006.01)
*G11C 8/00*    (2006.01)

(52) U.S. Cl. .................. 365/189.05; 365/233; 327/91; 327/94

(58) Field of Classification Search ............ 365/189.05
See application file for complete search history.

(56) References Cited

U.S. PATENT DOCUMENTS 5,355,391 A * 10/1994 Horowitz et al. ........... 375/257
6,507,224 B1 * 1/2003 Lee et al. ..................... 327/91
2004/0076228 A1 * 4/2004 Park et al. .................. 375/233
2004/0202270 A1 * 10/2004 Lentine et al. ............. 375/376
2004/0230388 A1 * 11/2004 Kim et al. ..................... 702/64
2005/0180498 A1 * 8/2005 Bhakta et al. .............. 375/233

* cited by examiner

*Primary Examiner*—Son Mai
(74) *Attorney, Agent, or Firm*—Volentine Francos & Whitt, PLLC

(57) ABSTRACT

A receiving device which may include a plurality of pre-amplifiers and a plurality of samplers. Each of the plurality of samplers is connected to the output ports of a corresponding pre-amplifier. Each sampler samples data signals input thereto in response to a corresponding clock signal. The receiving device of a semiconductor memory unit may reduce input capacitance seen from the outside of chip and eliminate mutual interference of signals so as to prevent errors from being generated when data is extracted in the event of over sampling using pre-amplifiers. Furthermore, the receiving device can separately control the pre-amplifier for samplers that receive clock signals for data alignment and the pre-amplifier for samplers that accept clock signals for repeated data reception.

14 Claims, 10 Drawing Sheets

(PRESENT INVENTION)

(PRESENT INVENTION)

(PRESENT INVENTION)

INPUT SIGNAL RECEIVING DEVICE OF SEMICONDUCTOR MEMORY UNIT

BACKGROUND OF THE INVENTION

1. Field of the Invention

Embodiments of the present invention relate to a receiving device of a semiconductor memory. This application claims the priority of Korean Patent Application No. 2003-90562, filed on Dec. 12, 2003, in the Korean Intellectual Property Office, the disclosure of which is incorporated herein in its entirety by reference.

2. Description of the Related Art

Semiconductor memory devices generally execute all operations according to input signals. These input signals are received through an input signal receiving device, which is synchronized with a clock signal. As the operating speeds of systems using semiconductor memory devices evolve and operate faster, the data processing speeds of the semiconductor memory devices also increase. To meet the high-speed data processing demands, the semiconductor memory device includes a plurality of input receivers. Each of these input receivers has a sensing latch circuit that compares input data with a reference voltage to sample the data (i.e. a sampler circuit).

SUMMARY OF THE INVENTION

Embodiments of the present invention relate to a semiconductor memory device which reduces mutual interference of neighboring samplers and decrease input capacitance when the semiconductor memory device operates at a high speed with relatively low amplitude signals, to improve the accuracy of data extraction. Further, embodiments of the present invention relate to a semiconductor memory device capable of reducing an input load due to over-sampling to enable multiple over-sampling.

According to aspects of embodiments of the present invention, a receiving device of a semiconductor memory unit comprises a plurality of pre-amplifiers and a plurality of samplers. Input ports of the samplers are connected to respective output ports of the pre-amplifiers. The samplers sample data signals input into the input ports of the samplers in response to clock signals. The receiving device of a semiconductor memory unit may include a reference voltage generator which generates predetermined reference voltages and a divider which divides an external clock signal to generate a plurality of clock signals. The samplers compare the data signals with the reference voltages in order to sample them.

The input ports of samplers of a first group among the plurality of samplers are each connected to the output ports of a corresponding first pre-amplifier among the plurality of pre-amplifiers. Likewise, the input ports of samplers of a second group among the plurality of samplers are each connected to the output ports of a corresponding second pre-amplifier among the plurality of pre-amplifiers. Each of the samplers of the first group samples data signals input into the input ports in response to a corresponding clock signal. Each of the samplers of the second group samples data signals input into the input ports in response to a corresponding clock signal.

The samplers of the first and second groups may sample the data signals, in response to corresponding clock signals having different phases. Each of the clock signals input into the samplers of the first group has a phase corresponding to the edge of the data signals and are aligned with the data signals and is used to extract the data signals. Each of the clock signals input into the samplers of the second group has a phase corresponding to a predetermined point between edges of the data signals and is used to extract the data signals. The divider generates internal clock signals corresponding to the plurality of samplers. The frequency of the internal clock signals is lower than the frequency of the data signals.

In a receiving device of a semiconductor memory unit, according to embodiments of the present invention, the input ports of samplers of a first group (among the plurality of samplers) are each connected to the output ports of a corresponding first pre-amplifier (among the plurality of pre-amplifiers). The input ports of samplers of a second group among the plurality of samplers are each connected to the output ports of a corresponding second pre-amplifier (among the plurality of pre-amplifiers). The input ports of samplers of a third group (among the plurality of samplers) are each connected to the output ports of a corresponding third pre-amplifier (among the plurality of pre-amplifiers). Each of the samplers (of the first group) samples data signals input into the input ports of the samplers (of the first group) in response to a corresponding clock signal, in response to a corresponding clock signal. Likewise, each of the samplers (of the second group) samples data signals input into the input ports of the samplers (of the second group) in response to a corresponding clock signal, in response to a corresponding clock signal. Further, each of the samplers (of the third group) samples data signals input into the input ports of the samplers (of the third group) in response to a corresponding clock signal.

The samplers of the first, second and third groups sample the data signals in response to corresponding clock signals having different phases. Each of the clock signals input into the samplers of the first group has a phase corresponding to the edge of the data signals and is aligned with the data signals. Each of the clock signals input into the samplers of the second group has a phase corresponding to a predetermined point between edges of the data signals and is used for extracting the data signals. Each of the clock signals input into the samplers of the third group has a phase corresponding to a predetermined point between edges of the data signals, which is different from the point corresponding to the phase of the clock signals of the second group samplers. All of these samplers are used for extracting the data signals.

BRIEF DESCRIPTION OF THE DRAWINGS

Example

Example

Example

Example

Example

Example

Example

Example

DETAILED DESCRIPTION OF THE INVENTION

In the following detailed description, example embodiments of the invention are shown and described, simply by way of illustration of the best mode contemplated by the inventor(s) of carrying out the invention. As will be realized, the invention is capable of modification in various obvious respects, all without departing from the spirit and scope of the invention. Accordingly, the drawings and description are to be regarded as illustrative in nature, and not restrictive.

Figure 1:
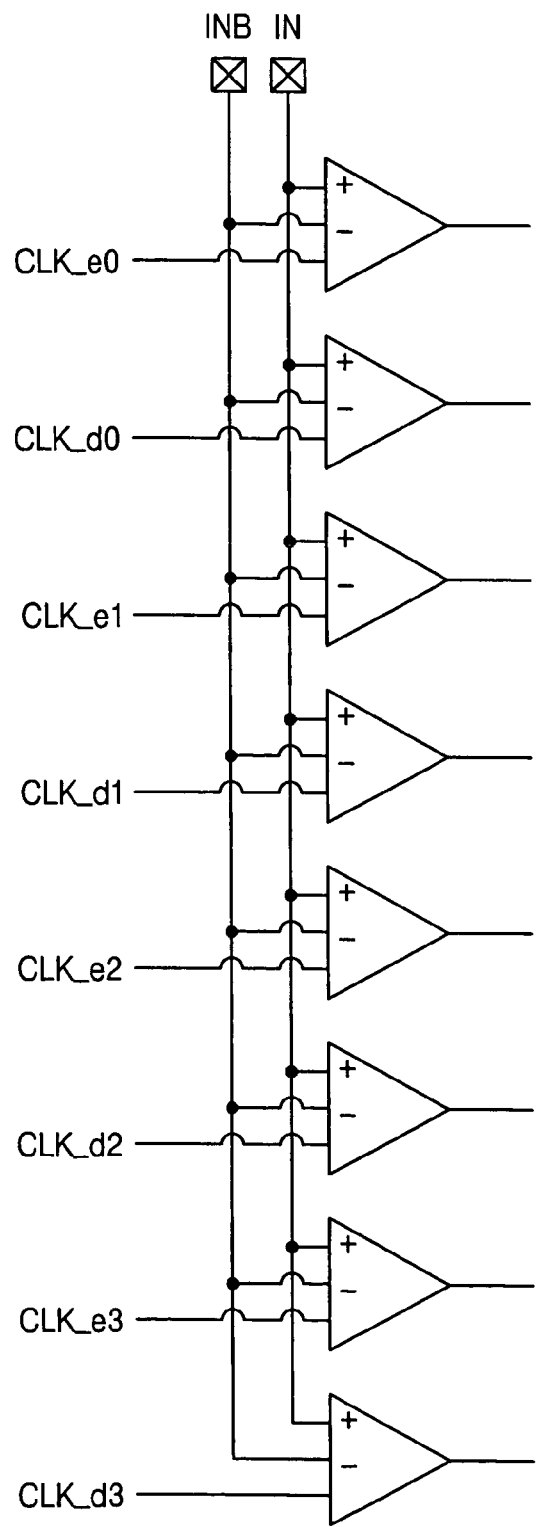
FIG. 1 shows an input signal receiving device of a memory unit having a plurality of samplers.

Example FIG. 1 shows an input signal receiving device of a memory unit having a plurality of samplers. To sample data input into each of the plurality of samplers, each sampler should sample the input data using a clock signal having a frequency higher than the frequency of the input data. However, it is difficult to generate a high-frequency clock signal that is correctly aligned with a data signal at a relatively high operating speed. Accordingly, a clock signal having a frequency lower than a sampled data signal is used for generating internal clock signals having multiple phase differences and sampling data through over sampling using the internal clock signals.

The input signal receiving device shown in example FIG. 1 is an over-sampling receiving circuit in a flash type memory device. This input signal receiving circuit includes eight samplers connected in parallel, which receive differential input signals IN and INB and extract desired data through over sampling. With this construction, the receiving circuit samples a single data item twice using clock signals having four different phases for reliable signal reception.

However, the receiving circuit shown in example FIG. 1 has a relatively large input capacitance. Consequently, high frequency characteristic of the receiving circuit may be poor when input signals have a high speed. Furthermore, the receiving circuit's input set-up and hold characteristics vary with the form of data. This reduces an actual sampling range and results in an increase in the probability of error generation. Moreover, since a high-speed clock signal generator is required in order to reduce the input capacitance, while improving frequency-related reception characteristic, the chip area and power consumption of the semiconductor memory are increased. In addition, the noise of clock signals affect the actual receiving window of data.

Figure 2:
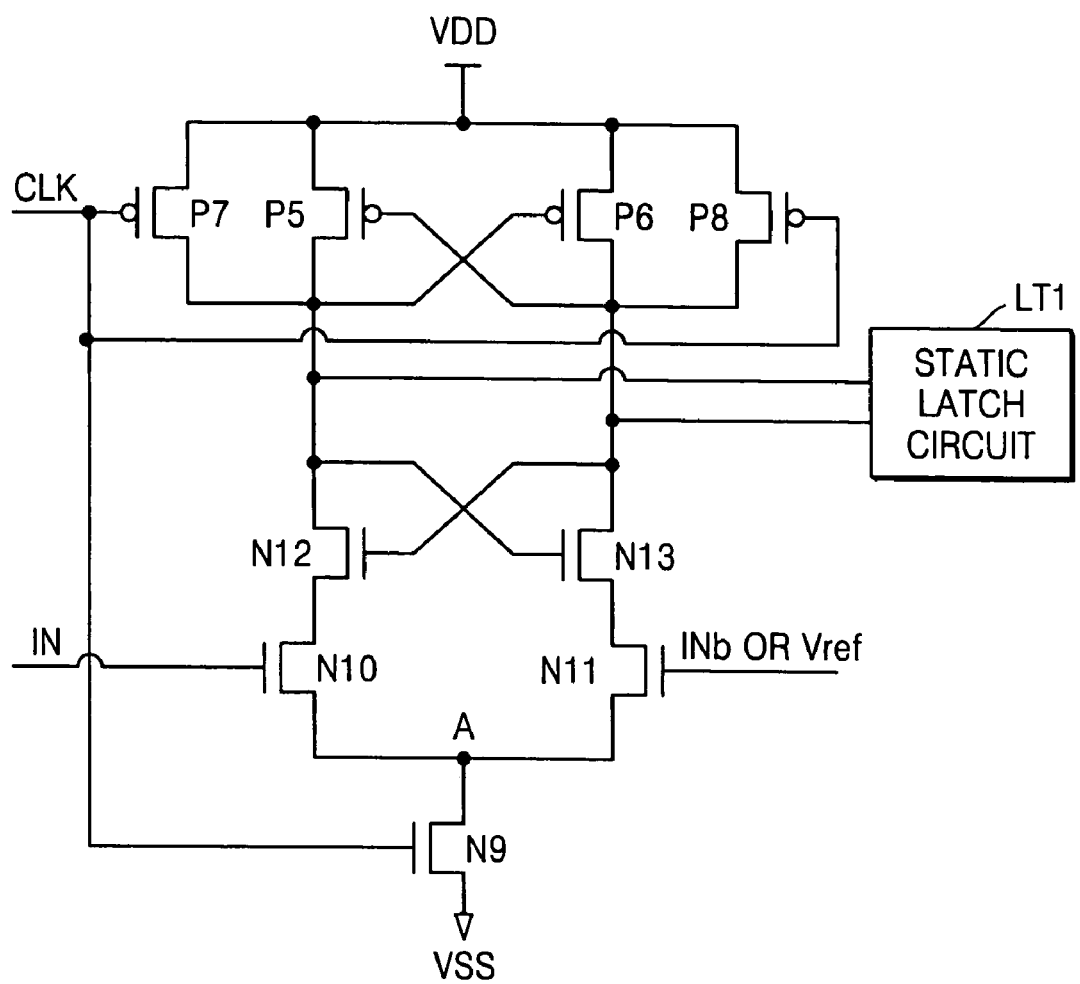
FIG. 2 is a circuit diagram of a signal sampler that receives an input signal.

Example FIG. 2 is a circuit diagram of a general signal sampler receiving an input signal. The signal sampler shown in example FIG. 2 is synchronized with a clock signal and receives an external input signal through only a NMOS transistor. Accordingly, the largest voltage gain can be obtained when the input signal level has a high voltage. However, when the input signal has a low voltage, the voltage gain becomes smaller than that of the high-voltage input signal so that the actual set-up and hold margin varies, reducing the entire receiving window.

The signal sampler should directly latch input signals using the clock signal without having a pre-receiving stage. Thus, eight samplers must be connected in parallel with input pins, as shown in example FIG. 1. Accordingly, the NMOS gate capacitance value is increased, which results in deterioration in the capability of the entire receiving part. Moreover, signal interference may occur during small-signal high-speed operation because the eight samplers are arranged at a small interval. To communicate with a semiconductor chip having various input/output characteristics, a separate transceiver for converting a signal level is needed. In addition, in the circuit of example FIG. 2, the voltage gain of the entire receiving part is deteriorated because there is no pre-receiving stage and only differential signals can be received. Also, the circuit cannot be used in a signal system that transmits data with only a single signal varying with a reference voltage.

Figure 3A:
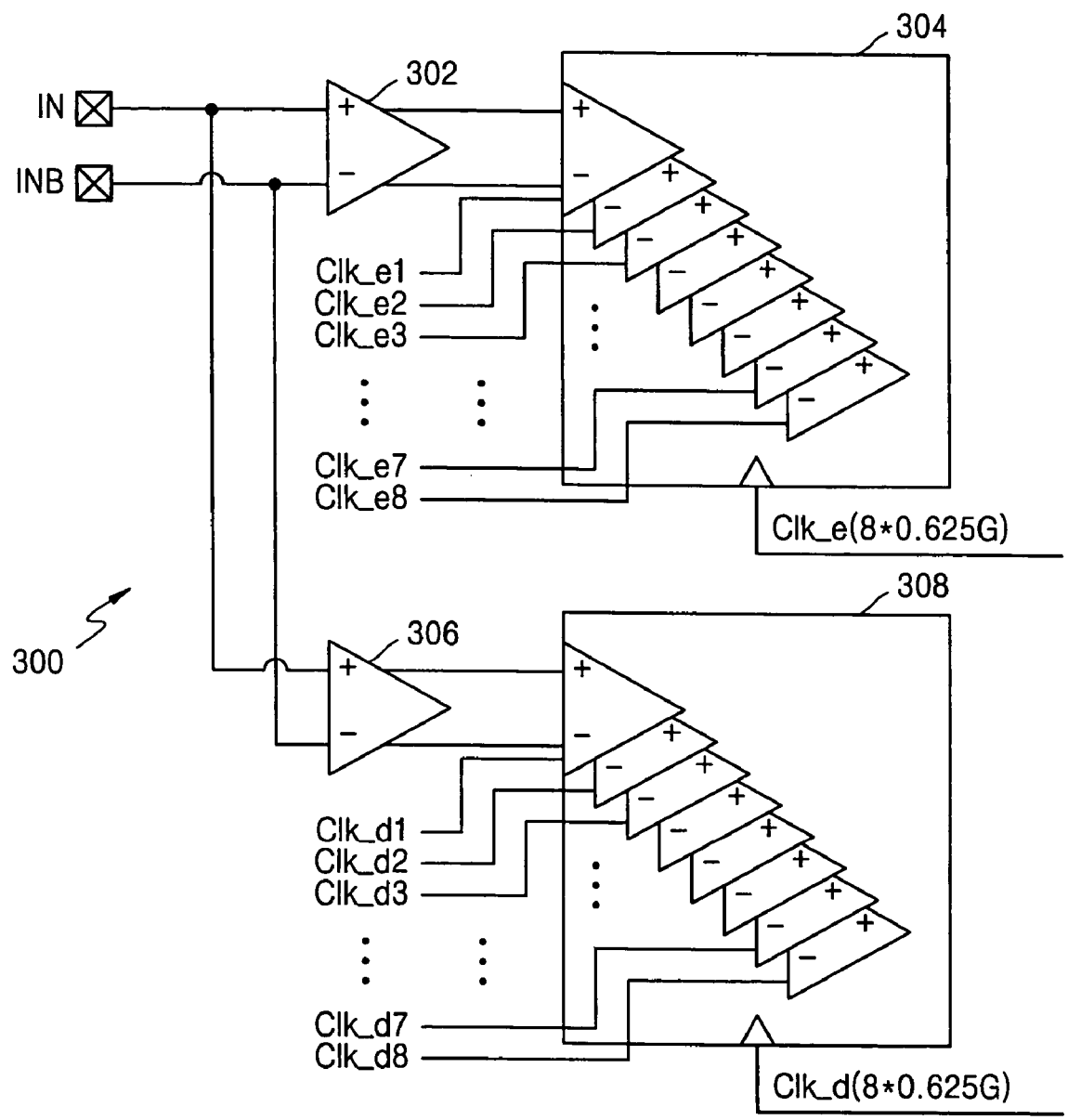
FIG. 3A shows a receiving device of a semiconductor memory unit.

Example FIG. 3A illustrates a receiving device of a semiconductor memory unit according to embodiments of the present invention. An external data signal is input into the receiving device as differential input signals IN and INB. The receiving device 300 includes a plurality of pre-amplifiers 302 and 306 and first and second sampler groups 304 and 308. The input ports of the samplers 304 and 308 are connected to the output ports of the pre-amplifiers 302 and 306, respectively.

The receiving device 300 includes a reference voltage generator (not shown) for generating predetermined reference voltages and a divider circuit (not shown) for dividing an external clock signal to generate a plurality of divided clock signals. The first and second sampler groups 304 and 308 compare the input data signals with the reference voltages or compare differential-amplified complementary data signals to each other to sample the data signals. Each of the first and second sampler groups 304 and 308 includes 8 samplers. The first and second sampler groups sample the data signals in response to corresponding clock signals Clk_ei and Clk_di, respectively, (i=1–8).

Figure 3B:
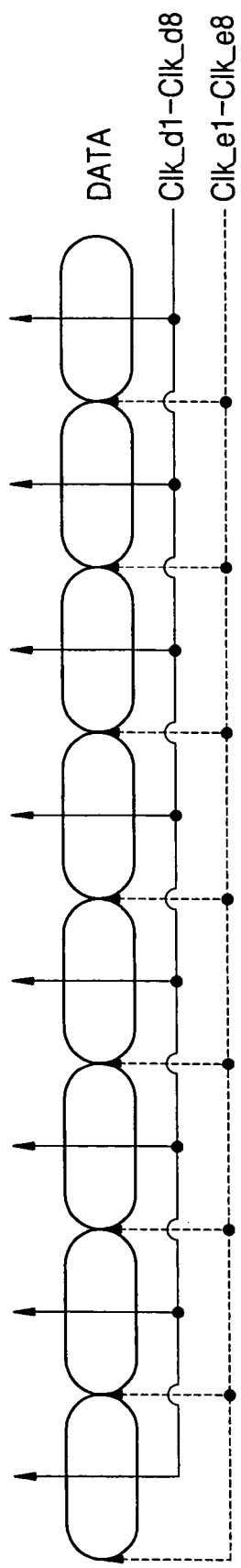
FIG. 3B shows the relationship between clock signals and a data signal input into the receiving device of example FIG. 3A.

Example FIG. 3B illustrates the relationship of the clock signals and data signals input into the receiving device shown in example FIG. 3A. The clock signals Clk_e1 through Clk_e8 input into the first sampler group 304 are synchronized with the rising and/or falling edge of the inputted data signals to be aligned with the data signals. The clock signals Clk_e1 through Clk_e8 have a phase difference corresponding to the frequency of the input data signal. The clock signals Clk_d1 through Clk_d8 input into the second sampler group 308 are synchronized at the middle point between the edges of the data signals to sample the data signals at that point. The clock signals Clk_d1 through Clk_d8 also have a phase difference corresponding to the frequency of the input data signals.

For example, if the input data signals IN and INB are 5 GHz signals, a sample clock signal having a frequency of approximately 10 GHz is required for sampling the inputted data signals through a single sampler. However, it is very difficult to generate a clock signal having accurate frequency for correctly sampling data. It is also difficult to sample data through a single sampler using a high-frequency clock signal, because the operating speed of the semiconductor memory device must be increased.

Accordingly, embodiments of the present invention employ sampling an input data signal using a plurality of clock signals with frequencies lower than the frequency of the input data signal. There is a phase difference (corresponding to the frequency of the data signal) between adjacent clock signals among the plurality of clock signals. For example, when a 5 GHz data signal is input, eight 0.625 GHz sampling signals having a phase difference of 45 degrees, six 0.833 GHz sampling signals having a phase difference of 60 degrees or four 1.25 GHz sampling signals having a phase difference of 90 degrees are used. Accordingly, correct sampling can be carried out using a low frequency that is easy to generate, which is called over sampling.

The circuit illustrated in example FIG. 3A is a receiving device using two over-samplers. This receiving device divides a clock signal into eight 0.625 GHz clock signals and aligns them with differential data signals. Accordingly, the divided clock signals are used to correctly extract signals from the middle points of the data signals.

In example FIG. 3B, Clk_ei (i=1–8) is a clock signal used for synchronizing the differential data signals and Clk_di (i=1–8) is a clock signal used for correctly extracting signals from the middle points of the data signals. There are eight clock signals Clk_e1 through Clk_e8 and eight clock signals Clk_d1 through Clk_d8 so that eight samplers are needed for each of the two clock signal groups. In order to maintain voltage gain, it may be more effective to use two independent pre-amplifiers rather than one.

Referring to example FIGS. 3A and 3B, the data signals input through the receiving ports IN and INB are amplified by the pre-amplifiers 302 and 304. The data signals output from the first pre-amplifier 302 are applied to the eight samplers of the first sampler group 304 that are synchronized with sampling clock signals corresponding to the edges of the data signals and align the data signals with the clock signals. Each of the eight samplers of the first sampler group 304 is synchronized with a sampling clock signal having a corresponding phase difference to sample the data signals and output them.

The data signals output from the second pre-amplifier 306 are input into the eight samplers of the second sampler group 308 that are synchronized with sampling clock signals corresponding to the middle points of the edges of the data signals, as shown in example FIG. 3B, to sample the data signals. Each of the eight samplers of the second sampler group 308 is synchronized with a corresponding sampling clock signal having a corresponding phase difference to sample the data signals and output them.

When data is sampled using sampling clock signals having multiple phase differences and over sampling, input capacitance may be relatively large, resulting in generation of errors during data sampling in small-signal high-speed operation. To maintain adequate voltage gain, according to small-signal high-speed operation, sufficient magnitudes of voltage and current are supplied to the multiple samplers through the pre-amplifiers 302 and 306. The use of pre-amplifiers 302 and 306 may prevent these sampling errors from occurring. Further, a method of repeatedly receiving data more than three times (rather than only twice) may be utilized in order to improve receiving performance, if pre-amplifiers 302 and 306 are used.

Figure 4A:
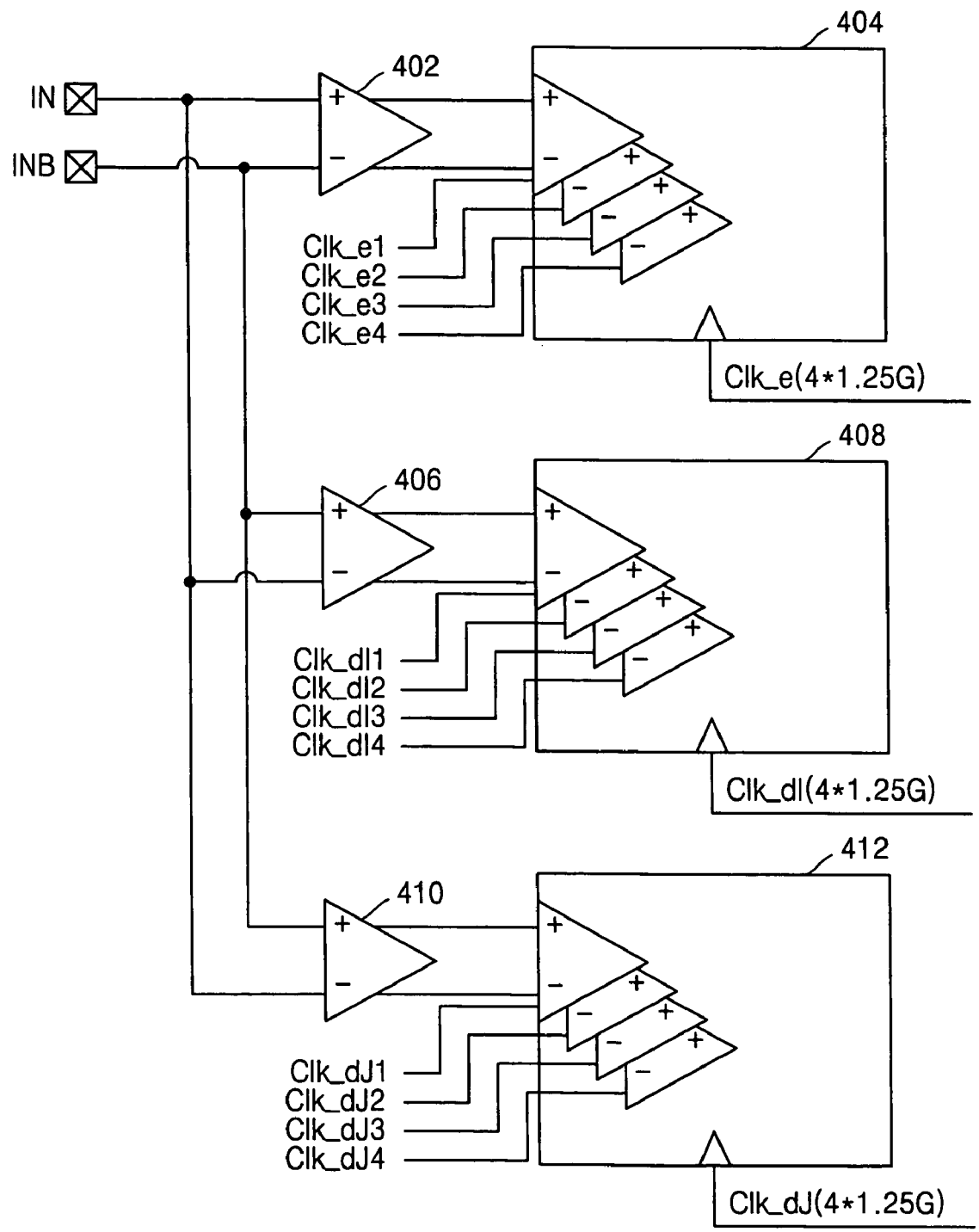
FIG. 4A shows a receiving device of a semiconductor memory unit.

Example FIG. 4A illustrates a receiving device of a semiconductor memory unit according to embodiments of the present invention. Referring to example FIG. 4A, the receiving device, according to embodiments of the present invention, includes a plurality of pre-amplifiers 402, 406 and 410 which are respectively connected to sampler groups 404, 408 and 412, each of which has a plurality of samplers for over sampling. Each of the first, second and third sampler groups 404, 408 and 412 includes four samplers. Each sampler samples data signals in response to a corresponding clock signal.

Figure 4B:
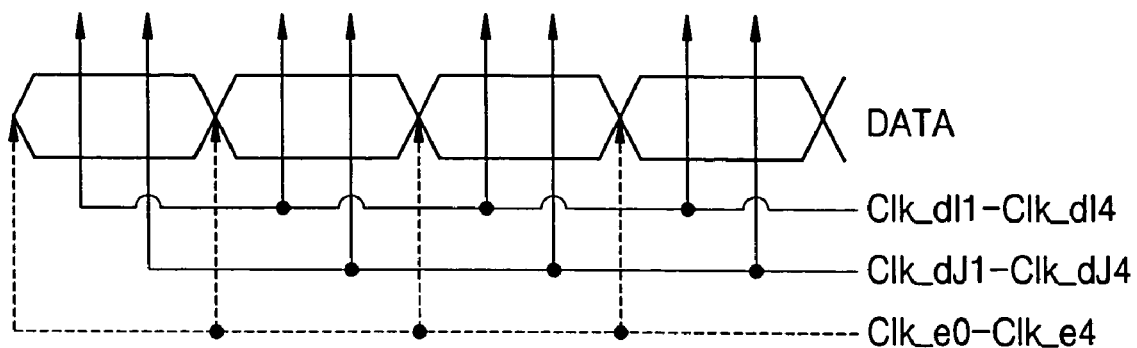
FIG. 4B shows the relationship between clock signals and a data signal input into the receiving device of example FIG. 4A.

Example FIG. 4B illustrates the relationship between clock signals and data signals. The first clock signals Clk_e1 through Clk_e4 input into the first sampler group 404 are synchronized with the rising and/or falling edges of the data signals to sample the data signals at their rising and/or falling edges. In other words, the first clock signals Clk_e1 through Clk_e4 are aligned with differential data signals. Each of these clock signals Clk_e1 through Clk_e4 has a phase difference corresponding to the frequency of the input data signals. The second clock signals Clk_dI1 through Clk_dI4 input into the second sampler group 408 are synchronized with a predetermined point between the edges of the data signals to sample the data signals at that point. Each of the second clock signals Clk_dI1 through Clk_dI4 also has the phase difference corresponding to the frequency of the input data signals. The third clock signals Clk_dJ1 through Clk_dJ4 input into the third sampler group 412 are synchronized with a predetermined point between edges of the data signals, which is different from the point with which the second clock signals are synchronized, to sample the data signals at that point. Each of the third clock signals Clk_dJ1 through Clk_dJ4 also has a phase difference corresponding to the frequency of the input data signals.

The circuit illustrated in example FIG. 4A is a receiving device using three over-samplers. This circuit uses four divided 1.25 GHz clock signals and aligns them with the differential data signals. These divided clock signals are used for executing twice sampling at points between the edges of data to correctly extract the data.

Referring to example FIGS. 4A and 4B, data signals inputted through receiving ports IN and INB are amplified by pre-amplifiers 402, 406 and 410. The data signals output from the first pre-amplifier 402 are applied to the four samplers of the first sampler group 404 that are synchronized with sampling clock signals corresponding to the edge of the data signals to align the data signals with the clock signals. Each of the four samplers 404 is synchronized with a sampling clock signal having a corresponding phase difference to sample the data signals and output the data signals.

Referring to example FIG. 4B, the data signals output from the second pre-amplifier 406 are applied to the four samplers of the second sampler group 408, that are synchronized with sampling clock signals corresponding to a first predetermined point of the data signals, to sample the data signals. Each of the four samplers of the second sampler group 408 is synchronized with a sampling clock signal having a corresponding phase difference to sample the data signals and output the data signals.

Similarly, referring to example FIG. 4B, the data signals output from the third pre-amplifier 410 are applied to the four samplers of the third sampler group 412 that are synchronized with sampling clock signals corresponding to a second predetermined point of the data signals, to sample the data signals. Each of the four samplers of the third sampler group 412 is synchronized with a sampling clock signal having a corresponding phase difference to sample the data signals and output the data signals.

Even if data is repeatedly received (e.g. at least three times) for the purpose of increasing receiving performance, the data received through pre-amplifiers is used in over sampling to maintain adequate voltage gain, according to small-signal high-speed operation, while reducing input capacitance. For example, if data is sampled using eight divided clock signals, a total of 24 samplers are needed, so that an input load viewed from the outputs of the pre-amplifiers increases. In this case, four clock signals obtained by dividing a 1.25 GHz clock signal can be used. Limitations of using high-frequency clock signals can be overcome by receiving data by over sampling three times to increase receiving reliability. As a further example, a receiving device, in high-frequency operation, that repeatedly receives data (e.g. data three times using six divided 0.833 GHz clock signals) can reduce chip size and power consumption, while decreasing the input load seen from the outputs of the pre-amplifiers.

Figure 5:
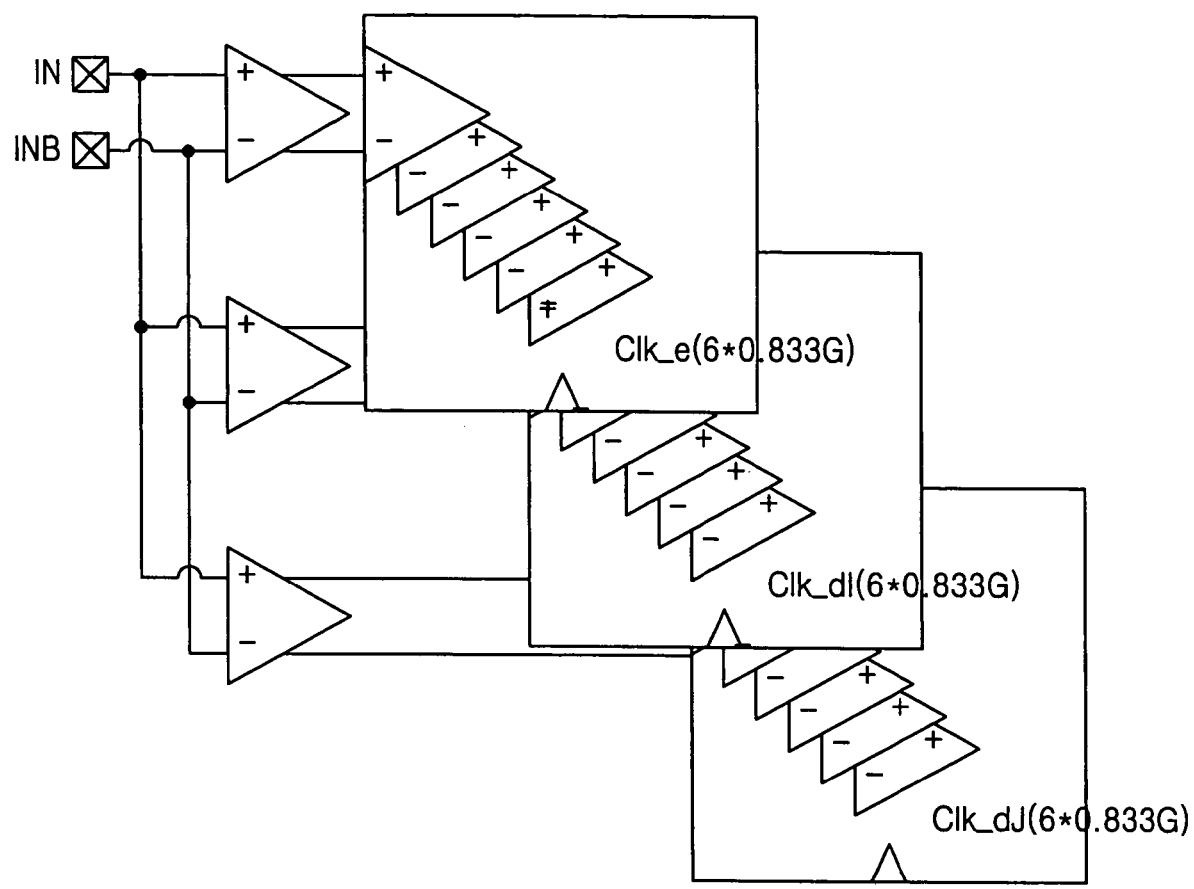
FIG. 5 shows a receiving device of a semiconductor memory unit.

Example FIG. 5 illustrates a receiving device of a semiconductor memory unit according to embodiments of the present invention. The receiving device illustrated in example FIG. 5 samples data in a similar manner as the receiving device illustrated in example FIG. 4A. However, the number of over samplers of the receiving device of example FIG. 5 is different from that of the receiving device of example FIG. 4A. For example, the receiving device of example FIG. 5 repeatedly receives data three times using six divided 0.833 GHz clock signals, and it has a pre-amplifier located in front of each sampler to maintain adequate voltage gain, to prevent the generation of errors when data is extracted.

When repeated reception of more than three times is carried out (e.g. as in the receiving devices shown in example FIGS. 4A and 5), a capacitance value viewed from the input ports may become relatively large. A receiving device of a semiconductor memory unit having multiple data pins is not effective because it requires a large area and current. In a semiconductor memory device of embodiments of the present invention, that converts parallel signals into high-speed serial small-signals to transmit them, it is important to limit the number of input/output pins and increase reliability of receiving performance. This may be accomplished through use of pre-amplifiers.

The receiving devices that repeatedly receive data more than three times, as illustrated in example FIGS. 4A and 5, include a plurality of sampler groups to increase receiving reliability. In addition, they have a plurality of pre-amplifiers respectively corresponding to the plurality of sampler groups to adequately increase voltage gain while reducing input capacitance.

In embodiments, a pre-amplifier for receiving data does not require a large voltage gain, compared to the pre-amplifier used for aligning clock signals with data. Accordingly, in embodiments, the receiving device can provide a signal to the multiple sampler groups using only a single pre-amplifier. Therefore, the chip area and power consumption of the semiconductor memory unit, may be reduced and receiving performance can be controlled using repeated reception according to system characteristics only by installing the pre-amplifier of the receiving path for data alignment and the pre-amplifier for receiving data.

The receiving device, utilizing over sampling, according to embodiments of the present invention, can reduce input capacitance viewed from the outside of the chip and increase the overall voltage gain required for small-signal high-speed operation to prevent mutual interference of neighboring samplers. Furthermore, the pre-amplifier for samplers receiving clock signals for data alignment and the pre-amplifier for samplers receiving clock signals for repeatedly receiving data are separately arranged and controlled so that input load caused by over sampling can be divided. The receiving device, of embodiments of the present invention enable over sampling of more than four times for the purpose of improving reception reliability, because it is not restricted by the number of samplers.

Figure 6A:
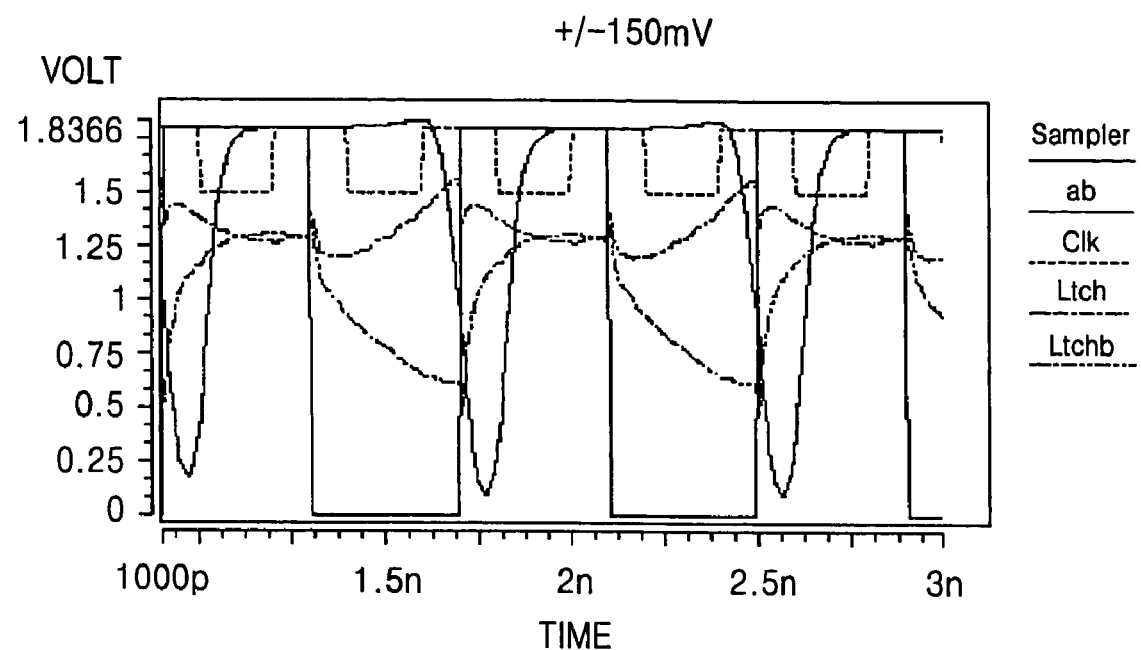
FIGS. 6A, 6B and 6C are graphs showing sampling results according to swing levels.
Figure 6A:
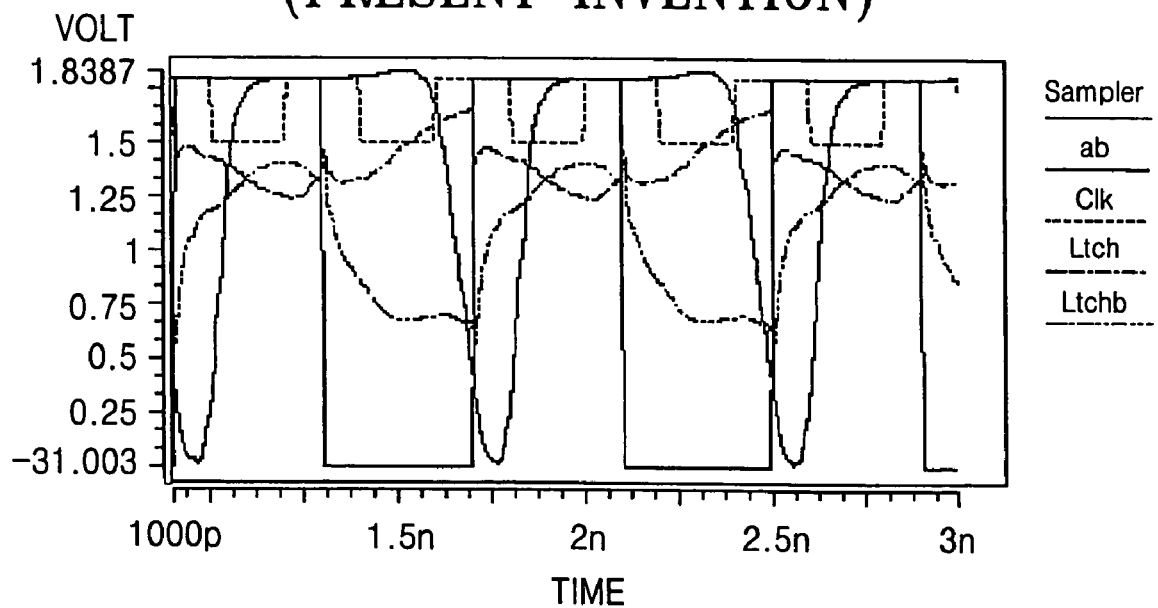
Figure 6B:
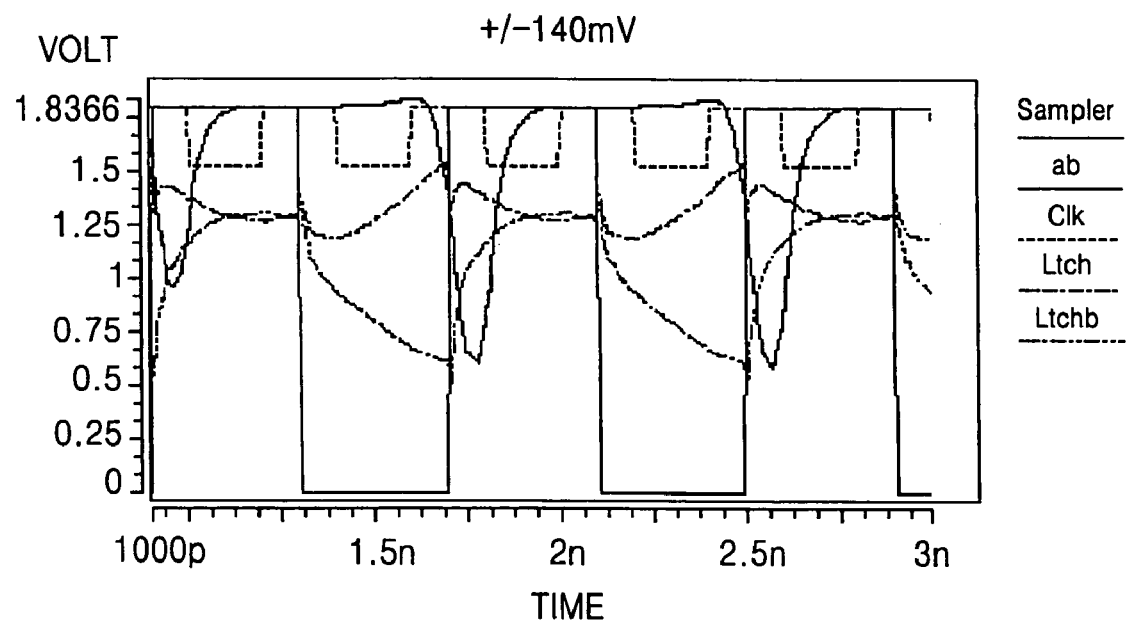
Figure 6B:
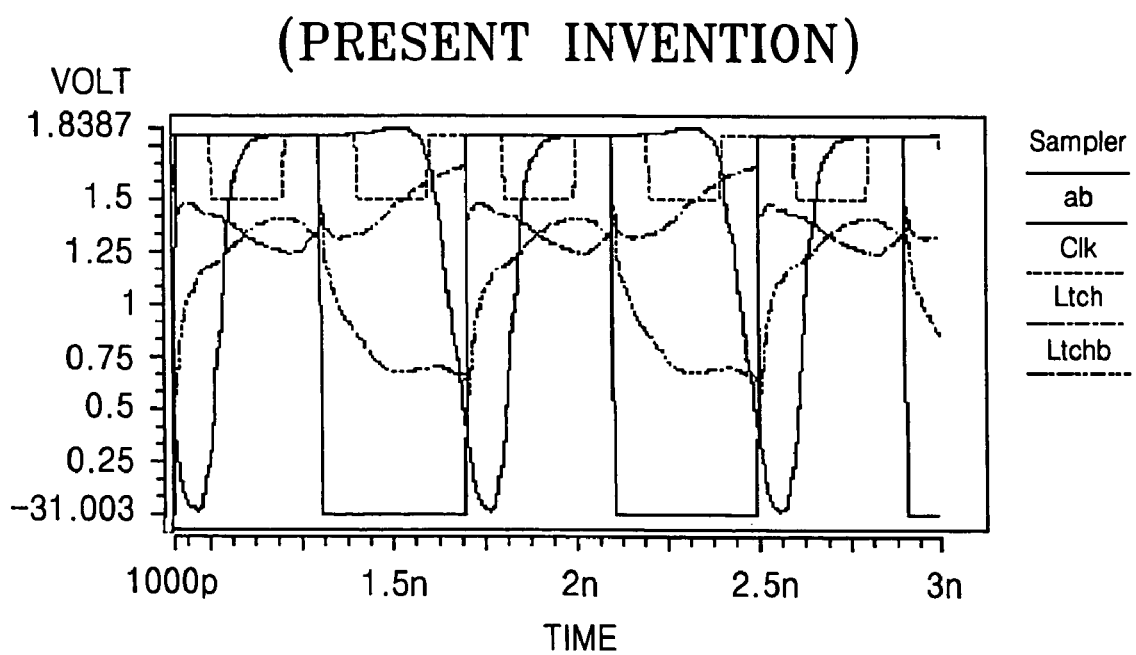
Figure 6C:
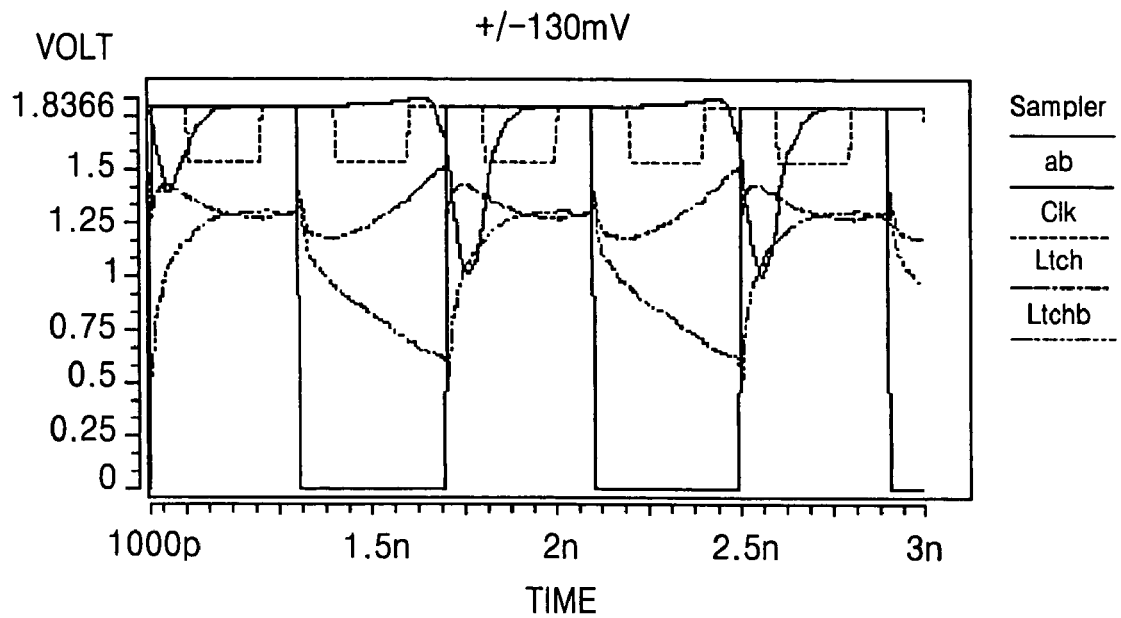
Figure 6C:
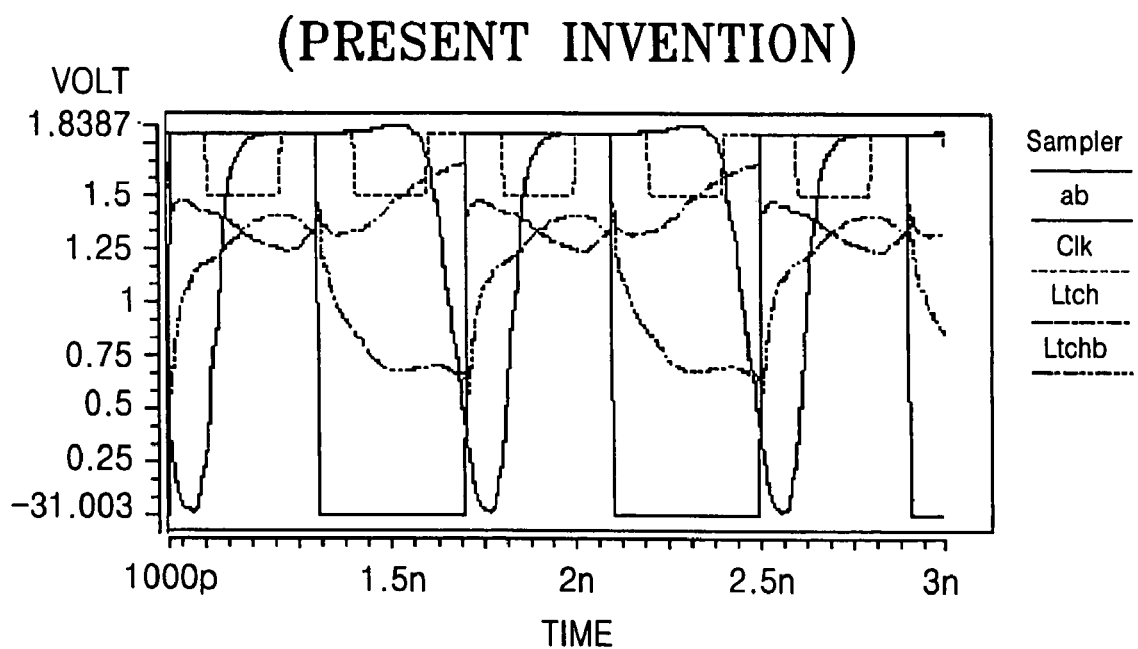

Example FIGS. 6A, 6B and 6C are graphs showing sampling results according to swing levels. In example FIGS. 6A, 6B and 6C, upper graphs show the prior art and lower graphs show example implementations of embodiments of the present invention. Example FIG. 6A shows a comparison of sampling results of the prior art and embodiments of the present invention when data swings at the level 150 mV. Example FIG. 6B illustrates sampling results of the prior art and embodiments of the present invention when data swings at 140 mV. Example FIG. 6C shows sampling results when data swings at 130 mV.

In the case that input data swings at the sufficient level (e.g. 150 mV), errors are not generated when the data is extracted, even though a pre-amplifier is not used. However, the receiving device of the prior art generates errors, as illustrated in the upper graphs of example FIGS. 6B and 6C when the data swings at 140 mV, 130 mV, or a lower level. The results obtained using the receiving device of embodiments of the present invention, shown in the lower graphs of example FIGS. 6B and 6C, mean that correct data extraction is carried out without having sampling error even if the data swing level is low.

According to embodiments of the present invention, the receiving device using over sampling of a semiconductor memory unit can reduce input capacitance viewed from the outside of chip and eliminate mutual interference of signals so as to prevent errors from being generated when data is extracted, by using pre-amplifiers. Further, the receiving device according to embodiments of the present invention can separately control the pre-amplifier for samplers receiving clock signals for data alignment and the pre-amplifier for samplers receiving clock signals for repeatedly receiving data to divide input load caused by over sampling. Moreover, the receiving device of embodiments of the present invention enables over sampling of more than four times for the purpose of improving reception reliability.

While embodiments of the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An apparatus comprising a receiving device of a semiconductor memory unit which comprises:
   a plurality of pre-amplifiers; and
   a plurality of samplers,
   wherein input ports of the samplers are connected to respective output ports of the pre-amplifiers, and the respective samplers sample data signals input into the input ports of the plurality of samplers in response to corresponding clock signals
   wherein the input ports of samplers of a first group among the plurality of samplers are each connected to the output ports of a corresponding first pre-amplifier among the plurality of pre-amplifiers, wherein the input ports of samplers of a second group among the plurality of samplers are each connected to the output ports of a corresponding second pre-amplifier among the plurality of pre-amplifiers, and wherein each of the samplers of the first and second group samples data signals input into the input ports thereof in response to a corresponding clock signal, and
   wherein each of the samplers of a first group and the second group sample the data signals in response to corresponding clock signals having different phases, wherein each of the clock signals input into the samplers of the first group has a phase corresponding to the edge of the data signals and is aligned with the data signals, and wherein each of the clock signals input mo the samplers of the second group has a phase corresponding to a predetermined point between edges of the data signals and is used for extracting the data signals.

2. The apparatus as claimed in claim 1, further comprising:
   a reference voltage generator for generating predetermined reference voltages; and
   a divider for dividing an external clock signal to generate a plurality of clock signals, wherein the samplers compare the data signals with the reference voltages to sample them.

3. The apparatus as claimed in claim 2, wherein the divider generates internal clock signals respectively corresponding to the plurality of samplers, and the frequency of the internal clock signals is lower than the frequency of the data signals.

4. An apparatus comprising a receiving device of a semiconductor memory unit which comprises:
   a plurality of pre-amplifiers; and
   a plurality of samplers,
   wherein input ports of the samplers are connected to respective output ports of the pre-amplifiers, and the respective samplers sample data signals input into the input ports of the plurality of samplers in response to corresponding clock signals,
   wherein the input ports of samplers of a first group among the plurality of samplers are each connected to the output ports of a corresponding first pre-amplifier among the plurality of pre-amplifiers, wherein the input ports of samplers of a second group among the plurality of samplers are each connected to the output ports of a corresponding second pre-amplifier among the plurality of pre-amplifiers, wherein the input ports of samplers of a third group among the plurality of samplers are each connected to the output ports of a corresponding third pre-amplifier among the plurality of pre-amplifiers, and wherein each of the samplers of the first, second, and third group samples data signals input into the input ports of the samplers in response to a corresponding clock signal, and
   wherein each of the samplers of the first, second, and third groups samples the data signals in response to corresponding clock signals having different phases, wherein each of the clock signals input into the samplers of the first group has a phase corresponding to the edge of the data signals and is aligned with the data signals, wherein each of the clock signals input into the samplers of the second group has a phase corresponding to a predetermined point between edges of the data signals and is used for extracting the data signals, and wherein each of the clock signals input into the samplers of the third group has a phase corresponding to a predetermined point between edges of the data signals, which is different from the point corresponding to the phase of the clock signals of the second group samplers, and is used for extracting the data signals.

5. A method comprising receiving data in a semiconductor memory, wherein said receiving comprises:
   amplifying data input from the outside; and
   sampling the amplified data, synchronizing the data with an internal clock signal,
   wherein said data sampling comprises generating a plurality of internal clock signals having multiple phase differences from an external clock signal, sampling the data by synchronizing the data with the plurality of internal clock signals, and sequentially outputting the plurality of sampled data contents in the order of the phase differences, and
   wherein said data sampling further comprises repeatedly sampling the same data multiple times, and detecting the sampled data through combination of the repeatedly sampled data contents.

6. The method as claimed in claim 5, wherein the data sampling compares the data with a reference voltage to sample the data.

7. A receiving device of a semiconductor unit, comprising:
   an input terminal;
   a first pre-amplifier connected to the input terminal and including a first output port which outputs first data signals;
   a second pre-amplifier connected to the input terminal and including a second output port which outputs second data signals;
   a first group of samplers connected to the first output port of the first pre-amplifier, wherein the first group of samplers sample the first data signals in response to first clock signals;
   a second group of samplers connected to the second output port of the second pre-amplifier, wherein the second group of samplers sample the second data signals in response to second clock signals;
   wherein each of the first clock signals input has a phase corresponding to the edge of the first data signal and is aligned with the first data signals, and
   wherein each of the second clock signals has a phase corresponding to a predetermined point between edges of the second data signals and is used for extracting the data signals.

8. The receiving device as claims in claim 7, wherein each of the first and second groups of samplers includes eight samplers.

9. The receiving device as claimed in claim 8, wherein the first clock signals have phase differences relative to each other of forty-five degrees, and wherein the second clock signals have phase differences relative to each other of forty-five degrees.

10. The receiving device as claimed in claim 7, further comprising:
    a third pre-amplifier connected to the input terminal and including a third output port which outputs third data signals;
    a third group of samplers connected to the third output port of the third pre-amplifier, wherein the third group of samplers sample the third data signals in response to third clock signals;
    wherein each of the third clock signals has a phase corresponding to another predetermined point between edges of the third data signals.

11. The receiving device as claims in claim 10, wherein each of the first, second and third groups of samplers includes six samplers.

12. The receiving device as claimed in claim 11, wherein the first clock signals have phase differences relative to each other of sixty degrees, wherein the second clock signals have phase differences relative to each other of sixty degrees, and wherein the third clock signals have phase differences relative to each other of sixty degrees.

13. The receiving device as claims in claim 10, wherein each of the first, second and third groups of samplers includes four samplers.

14. The receiving device as claimed in claim 11, wherein the first clock signals have phase differences relative to each other of ninety degrees, wherein the second clock signals have phase differences relative to each other of ninety degrees, and wherein the third clock signals have phase differences relative to each other of ninety degrees.

* * * * *